(12) United States Patent
Kuramochi et al.

(10) Patent No.: US 7,605,738 B2
(45) Date of Patent: Oct. 20, 2009

(54) A-D CONVERTER AND A-D CONVERT METHOD

(75) Inventors: Yasuhide Kuramochi, Tokyo (JP); Akira Matsuzawa, Tokyo (JP)

(73) Assignees: Advantest Corporation, Tokyo (JP); Tokyo Institute of Technology, Tokyo (JP)

( * ) Notice: Subject to any disclaimer, the term of this patent is extended or adjusted under 35 U.S.C. 154(b) by 197 days.

(21) Appl. No.: 11/854,531

(22) Filed: Sep. 12, 2007

(65) Prior Publication Data

US 2008/0218393 A1 Sep. 11, 2008

Related U.S. Application Data

(63) Continuation-in-part of application No. 11/520,436, filed on Sep. 13, 2006, now Pat. No. 7,477,177.

(51) Int. Cl.
*H03M 1/12* (2006.01)
(52) U.S. Cl. ........................ 341/155; 341/156; 341/158; 341/159
(58) Field of Classification Search ................. 341/155, 341/156, 159, 158
See application file for complete search history.

(56) References Cited

U.S. PATENT DOCUMENTS

| | | | | |
|---|---|---|---|---|
| 6,177,899 | B1 * | 1/2001 | Hsu | 341/156 |
| 6,218,975 | B1 * | 4/2001 | Tsukamoto et al. | 341/159 |
| 7,477,177 | B2 * | 1/2009 | Kuramochi et al. | 341/156 |
| 7,479,914 | B2 * | 1/2009 | Kuramochi et al. | 341/156 |
| 2004/0189504 | A1 * | 9/2004 | Dasgupta | 341/156 |

FOREIGN PATENT DOCUMENTS

| | | |
|---|---|---|
| JP | H02-104024 | 4/1990 |
| JP | H02-278918 | 11/1990 |
| JP | H04-255113 | 9/1992 |
| JP | 05-160727 | 6/1993 |
| JP | H05-152960 | 6/1993 |

(Continued)

OTHER PUBLICATIONS

Article titled "An All-MOS Charge-Redistribution A/D Conversion Technique" jointly authored by Suarez et al., in IEEE International Solid-State Circuits Conference, Feb. 15, 1974 (pp. 194,195,248).

(Continued)

*Primary Examiner*—Jean B Jeanglaude
(74) *Attorney, Agent, or Firm*—Jianq Chyun IP Office

(57) ABSTRACT

There is provided an A/D converter that outputs a digital output signal obtained by digitalizing an analog input signal. The A/D converter includes a bit selecting section that selects a conversion object bit from a high-order bit to a low-order bit of the digital output signal in order, a threshold-value controlling section that determines a threshold data expressing a boundary value between zero and one of the conversion object bit, a D/A converting section that digital-to-analog converts the threshold data and generates an analog threshold value, a comparing section that compares, at a plurality of different timings in a conversion time interval determining a value of the conversion object bit, the analog input signal and the analog threshold value and outputs a plurality of comparison results at the timings, and a bit determining section that determines the value of the conversion object bit.

11 Claims, 11 Drawing Sheets

FOREIGN PATENT DOCUMENTS

| | | |
|---|---|---|
| JP | 2003-273735 | 9/2003 |
| WO | WO99/04496 | 1/1999 |

OTHER PUBLICATIONS

Article titled "A High-Speed, All-MOS Successive-Approximation Weighted Capacitor A/D Conversion Technique" jointly authored by McCreary et al., in IEEE International Solid-State Circuits Conference, Feb. 12, 1975 (pp. 38,39,211).

Article titled "All-MOS Charge Redistribution Analog-to-Digital Conversion Techniques-Part I" jointly authored by McCreary et al., in IEEE Journal of Solid-State Circuits, vol. SC-10, No. 6, Dec. 1975 (pp. 371-379).

* cited by examiner

A-D CONVERTER AND A-D CONVERT METHOD

CROSS REFERENCE TO RELATED APPLICATION

This is a continuation in-part application of Ser. No. 11/520,436 filed on Sep. 13, 2006, now U.S. Pat. No. 7,477,177 the contents of which are incorporated herein by reference.

BACKGROUND

1. Field of the Invention

The present invention relates to an A-D converter and an A-D convert method. More particularly, the present invention relates to an A-D converter and an A-D convert method for outputting a digital output signal obtained by digitalizing an analog input signal.

2. Related Art

An A-D converter converts an analog signal into a digital signal. The A-D converter is classified into a single bit mode in which an input signal is quantized by one bit in one clock and a multiple bit mode in which an input signal is quantized by multiple bits in one clock. The A-D converter with a single bit mode includes, for example, a successive-approximation type A-D converter and a delta-sigma type A-D converter. The successive-approximation type A-D converter is disclosed in Ricardo E. Suarez, Paul R. Gray, and David A. Hodges, "An All-MOS Charge-Redistribution A/D Conversion Technique", IEEE International Solid-State Circuits Conference, 1974, P. 194-195 and 248, James McCreary and Paul R. Gray, "A High-Speed All-MOS Successive-Approximation Weighted Capacitor A/D Conversion Technique", IEEE International Solid-State Circuits Conference, 1975, P. 38-39 and 211, JAMES L. McCREARY and PAUL R. GRAY, "All-MOS Charge Redistribution Analog-to-Digital Conversion Techniques-Part 1", IEEE JOURNAL OF SOLID-STATE CIRCUITS, VOL. SC-10, No. 6, DECEMBER 1975, P. 371-379. The A-D converter with a multiple bit mode includes, for example, a flash type A-D converter.

Meanwhile, the A/D converter may output an incorrect result in some cases when large noises are instantaneously included in the input signal. In particular, since the successive-approximation type A/D converter sequentially determines values from a high-order bit, the successive-approximation type A/D converter outputs a data value including gross errors when the high-order bit has a wrong comparison result.

In order to solve such a problem, it is considered that the A/D converter includes a low-pass filter having a large capacity in its input stage and removes instantaneously large noises. However, the A/D converter including such the low-pass filter has a delayed settling time, and thus has a long conversion time.

SUMMARY

Therefore, it is an object of some aspects of the present invention to provide an A-D converter and an A-D convert method that can solve the foregoing problems. The above and other objects can be achieved by combinations described in the independent claims. The dependent claims define further advantageous and exemplary combinations of the present invention.

That is, according to the first aspect of the present invention, there is provided an A/D converter that outputs a digital output signal obtained by digitalizing an analog input signal. The A/D converter includes: a bit selecting section that selects a conversion object bit from a high-order bit to a low-order bit of the digital output signal in order; a threshold-value controlling section that determines a threshold data expressing a boundary value between zero and one of the conversion object bit on the basis of an already-determined value of a higher-order bit than the conversion object bit; a D/A converting section that digital-to-analog converts the threshold data and generates an analog threshold value; a comparing section that compares, at a plurality of different timings in a conversion time interval determining a value of the conversion object bit, the analog input signal and the analog threshold value and outputs a plurality of comparison results at the timings; and a bit determining section that determines the value of the conversion object bit on the basis of the plurality of comparison results.

According to the second aspect of the present invention, there is provided an A/D converter that outputs a digital output signal obtained by digitalizing an analog input signal. The A/D converter includes: a plurality of comparators of which each compares the analog input signal and an analog threshold value according to a specified digital threshold data; a high-order field determining section that narrows down a data value corresponding to a high-order field for a predetermined bit number in the digital output signal on the basis of a plurality of comparison results obtained by supplying different threshold data to the plurality of comparators; a low-order field computing section that computes a plurality of candidate values for a data value corresponding to a low-order field for a predetermined number of bits located at a side lower than the high-order field by means of the plurality of comparators; a low-order field determining section that determines the data value corresponding to the low-order field on the basis of the plurality of candidate values; and a timing controlling section that causes, when computing the plurality of candidate values of the data value corresponding to the low-order field, a first comparator among the plurality of comparators to compare the analog input signal and the analog threshold value at a first timing in a conversion time interval determining a value for one bit and causes a second comparator among the plurality of comparators to compare the analog input signal and the analog threshold value at a second timing different from the first timing in the conversion time interval.

According to the third aspect of the present invention, there is provided an A/D convert method for outputting a digital output signal obtained by digitalizing an analog input signal. The A/D convert method includes: selecting a conversion object bit from a high-order bit to a low-order bit of the digital output signal in order; determining a threshold data expressing a boundary value between zero and one of the conversion object bit on the basis of an already-determined value of a higher-order bit than the conversion object bit; digital-to-analog converting the threshold data and generating an analog threshold value; comparing, at a plurality of different timings in a conversion time interval determining a value of the conversion object bit, the analog input signal and the analog threshold value and outputting a plurality of comparison results at the timings; and determining the value of the conversion object bit on the basis of the plurality of comparison results.

According to the fourth aspect of the present invention, there is provided an A/D convert method for outputting a digital output signal obtained by digitalizing an analog input signal. The A/D convert method includes: narrowing down a data value corresponding to a high-order field for a predetermined bit number in the digital output signal on the basis of a plurality of comparison results obtained by supplying different threshold data to a plurality of comparators of which each compares the analog input signal and an analog threshold value according to a specified digital threshold data; computing a plurality of candidate values for a data value corresponding to a low-order field for a predetermined number of bits located at a side lower than the high-order field by means of the plurality of comparators; determining the data value corresponding to the low-order field on the basis of the plurality of candidate values; and causing, when computing the plurality of candidate values of the data value corresponding to the low-order field, a first comparator among the plurality of comparators to compare the analog input signal and the analog threshold value at a first timing in a conversion time interval determining a value for one bit and causing a second comparator among the plurality of comparators to compare the analog input signal and the analog threshold value at a second timing different from the first timing in the conversion time interval.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
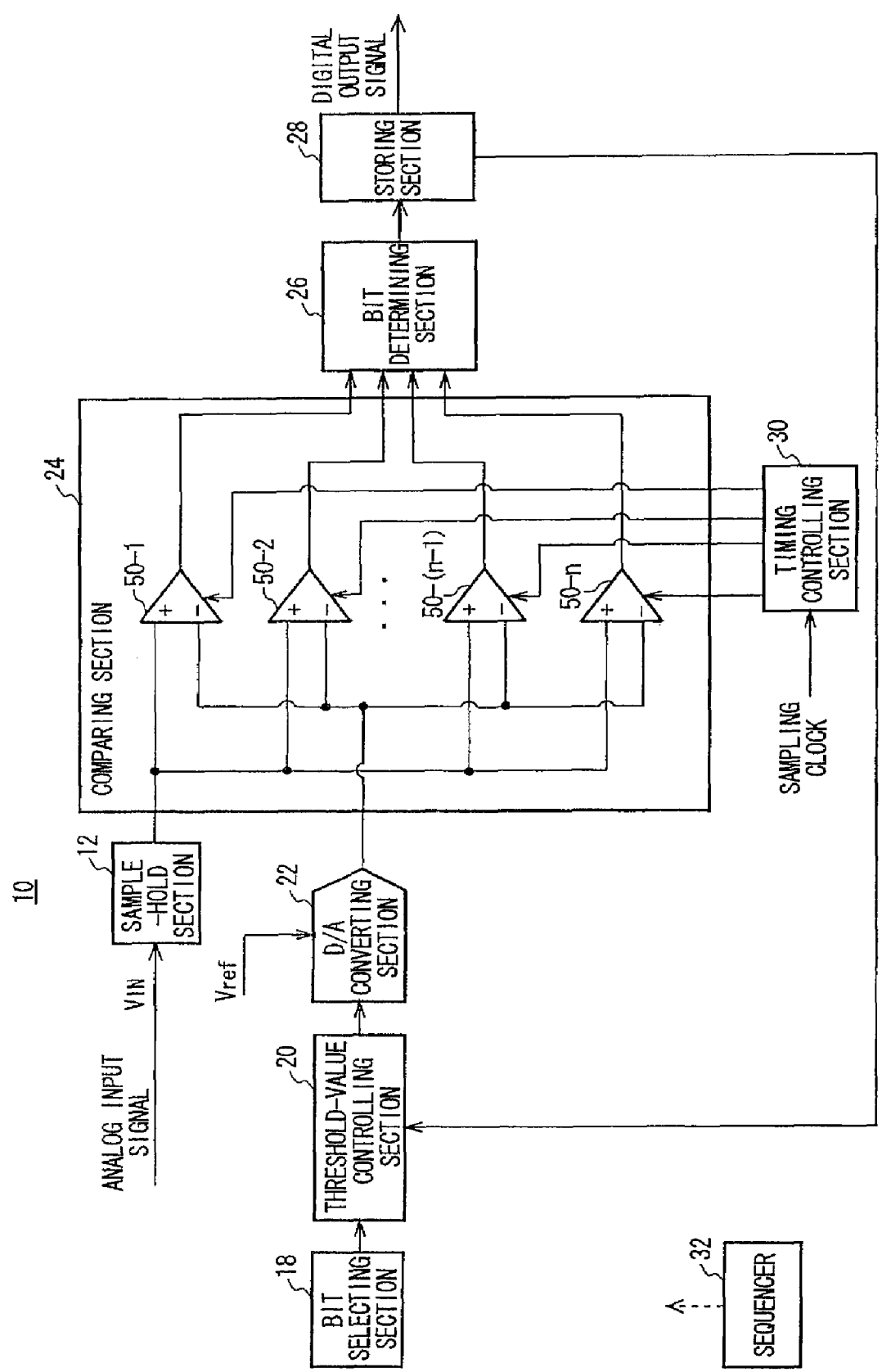
FIG. 1 shows a configuration of an A/D converter 10 according to an embodiment of the present invention.

FIG. 1 shows a configuration of an A/D (analog to digital) converter 10 according to an embodiment of the present invention. The A/D converter 10 is a successive-approximation type A/D converter, and outputs a digital output signal obtained by digitalizing an analog input signal. In the present embodiment, the A/D converter 10 converts a voltage value $V_{IN}$ of an analog input signal into an m-bit digital output signal every predetermined conversion period (analog-to-digital conversion period). In addition, m is an integer number of two or more.

The A/D converter 10 includes a sample-hold section 12, a bit selecting section 18, a threshold-value controlling section 20, a D/A converting section 22, a comparing section 24, a bit determining section 26, a storing section 28, a timing controlling section 30, and a sequencer 32. The sample-hold section 12 samples the analog input signal and holds the sampled analog input signal. As an example, the sample-hold section 12 may sample the voltage value $V_{IN}$ of the analog input signal by means of a capacitor and hold the voltage value $V_{IN}$ for a certain period.

The bit selecting section 18 selects a conversion object bit from a high-order bit to a low-order bit of the digital output signal in order. As an example, the bit selecting section 18 may select a conversion object bit by one bit in order from the most significant bit to the least significant bit every sampling clock timing. Moreover, the bit selecting section 18 may select a conversion object bit from a high-order bit to a low-order bit in order within a bit field that includes bits excepting a predetermined number of bits from the most significant bit. In this case, analog to digital conversion may be performed on the predetermined number of bits from the most significant bit by another A/D converter such as a flash type converter.

The threshold-value controlling section 20 determines a threshold data expressing a boundary value between zero and one of a conversion object bit on the basis of an already-determined value of a higher-order bit than the conversion object bit. In other words, the threshold-value controlling section 20 determines a threshold data expressing a boundary value between a range of the analog input signal in which a value of a conversion object bit in the digital output signal becomes zero and a range of the analog input signal in which the value of the conversion object bit becomes one, on the basis of the already-determined value stored on the storing section 28.

When the threshold-value controlling section 20 sequentially determines values from a high-order bit of the digital output signal as an example, the threshold-value controlling section 20 may use as a threshold data a data value expressing an intermediate value in a range in which a not-yet-determined bit field can have a value. For example, in the threshold-value controlling section 20, the number of bits of the threshold data is same as the number of bits of the digital output signal (m bits, for example). Then, the threshold-value controlling section 20 may output a threshold data in which higher-order bits than a digit corresponding to the conversion object bit are set to be the same as the already-determined values, a bit of the digit corresponding to the conversion object bit is set to be one, and lower-order bits than the digit corresponding to the conversion object bit are set to be zero.

The D/A converting section 22 digital-to-analog converts the threshold data and generates an analog threshold value. In the present embodiment, the D/A converting section 22 has at least a resolution of the number of bits (m bits) of the digital output signal, and is supplied with a reference voltage Vref and a ground (or, the reference voltage Vref and a minus-side reference voltage −Vref) as a reference potential. According to this, the D/A converting section 22 can digital-to-analog convert the threshold data expressed by m bits to output analog threshold values identical with boundaries of ranges corresponding to data values capable of being taken by the digital output signal.

The comparing section 24 compares the analog input signal and the analog threshold value at a plurality of different timings in a conversion time interval determining the value of the conversion object bit, and outputs a plurality of comparison results respectively compared at the timings. As an example, the comparing section 24 has a plurality of comparators 50. The plurality of comparators 50 respectively compares the analog input signal and the analog threshold value. As an example, each of the plurality of comparators 50 outputs Low logic (zero) when the analog input signal is not less than the analog threshold value and outputs High logic (one) when the analog input signal is less than the analog threshold value.

Furthermore, a first comparator 50-1 of the plurality of comparators 50 compares the analog input signal and the analog threshold value at a first timing in the conversion time interval determining the value of the conversion object bit. Moreover, a second comparator 50-2 of the plurality of comparators 50 compares the analog input signal and the analog threshold value at a second timing different from the first timing in the conversion time interval determining the value of the conversion object bit. According to this, the plurality of comparators 50 can compare the analog input signal and the analog threshold value at the plurality of different timings in the conversion time interval determining the value of the conversion object bit, and output the plurality of comparison results respectively compared at the timings.

In the present embodiment, the comparing section 24 has n comparators 50 (the first comparator 50-1 to the nth comparator 50-*n*). Here, n is an integer number of two or more. The n comparators 50-1 to 50-*n* respectively compare the analog input signal and the analog threshold value at timings different from one another in the conversion time interval determining the value of the conversion object bit. As an example, the n comparators 50-1 to 50-*n* may perform the comparison at timings of which each is deviated from the other timing by a time interval below a period of a sampling clock. According to this, in the present embodiment, the comparing section 24 can output n comparison results compared at n different timings in the conversion time interval determining the value of the conversion object bit. Moreover, in the present embodiment, the n comparators 50-1 to 50-*n* compare a voltage value $V_{IN}$ of the analog input signal and a voltage value supplied as the analog threshold value.

The bit determining section 26 determines the value (zero or one) of the conversion object bit on the basis of the plurality of comparison results output from the comparing section 24. As an example, the bit determining section 26 may determine the value of the conversion object bit by referring to the plurality of comparison results by majority decision. Then, the bit determining section 26 sequentially stores values respectively determined for the conversion object bits on the storing section 28. In the present embodiment, the bit determining section 26 may determine the value of the conversion object bit on the basis of comparison results performed by the k comparators 50 with a small error among the n comparators 50 included in the comparing section 24 (k is an integer number of not less than two and not more than n).

The storing section 28 stores the data value of the digital output signal that is determined by the bit determining section 26. Then, as an example, the storing section 28 may sequentially output data values of the digital output signal determined every analog-to-digital conversion period.

The timing controlling section 30 respectively supplies strobe signals to the plurality (n in the present embodiment) of comparators 50, and respectively controls comparison timings between the analog input signal and the analog threshold value in the plurality of comparators 50. For more detail, the timing controlling section 30 causes the first comparator 50 of the plurality of comparators 50 to perform the comparison at the first timing in the conversion time interval determining the value of the conversion object bit. Then, the timing controlling section 30 causes the second comparator 50 of the plurality of comparators 50 to perform the comparison at the second timing in the conversion time interval, which is different from the first timing.

As an example, the timing controlling section 30 may delay a sampling clock determining a conversion time interval for one bit by means of a delay element having a delay amount less than one period of the sampling clock, in order to generate a first strobe signal specifying the first comparison timing and a second strobe signal specifying the second comparison timing. In this case, the first comparator 50-1 compares the analog input signal and the analog threshold value according to the first strobe signal. Moreover, the second comparator 50-2 compares the analog input signal and the analog threshold value according to the second strobe signal. According to this, the timing controlling section 30 can generate a plurality of strobe signals of which each is deviated from the other strobe by an interval not more than the period of the sampling clock that determines a conversion time interval for one bit. Moreover, the timing controlling section 30 may supply in parallel to the n comparators 50 the first to the nth strobe signals of which each is deviated from the other strobe by the interval not more than the period of the sampling clock.

The sequencer 32 controls total operations for the A/D converter 10. As an example, the sequencer 32 controls operation timings for the bit selecting section 18, the threshold-value controlling section 20, the D/A converting section 22, and so on, outputs a sample-hold signal specifying a sample timing and a hold timing for the analog input signal, controls an output timing for the digital output signal stored on the storing section 28, and so on.

Figure 2:
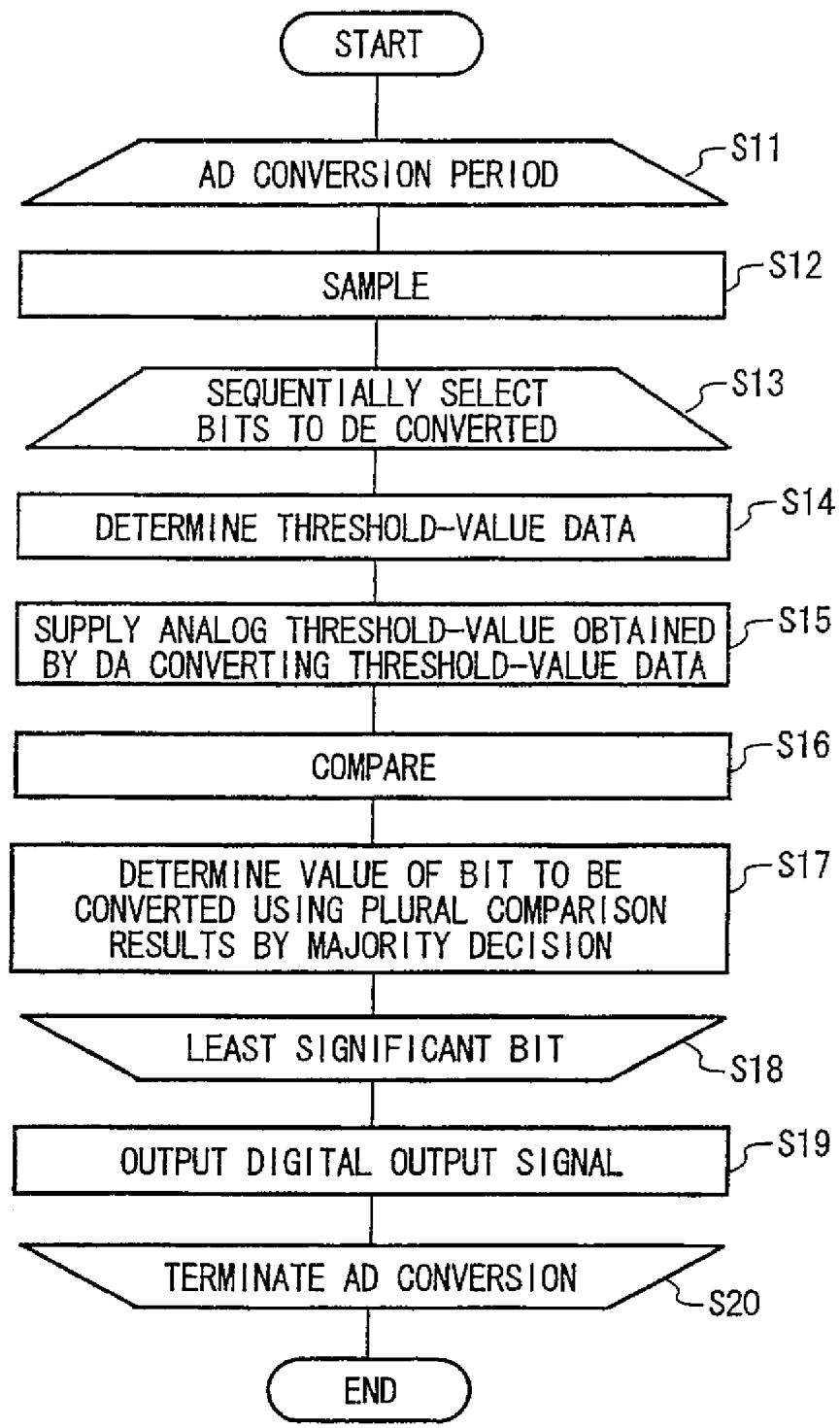
FIG. 2 shows an analog-to-digital conversion bit determining section 26 in an A/D converter 10 according to an embodiment of the present invention.
Figure 3:
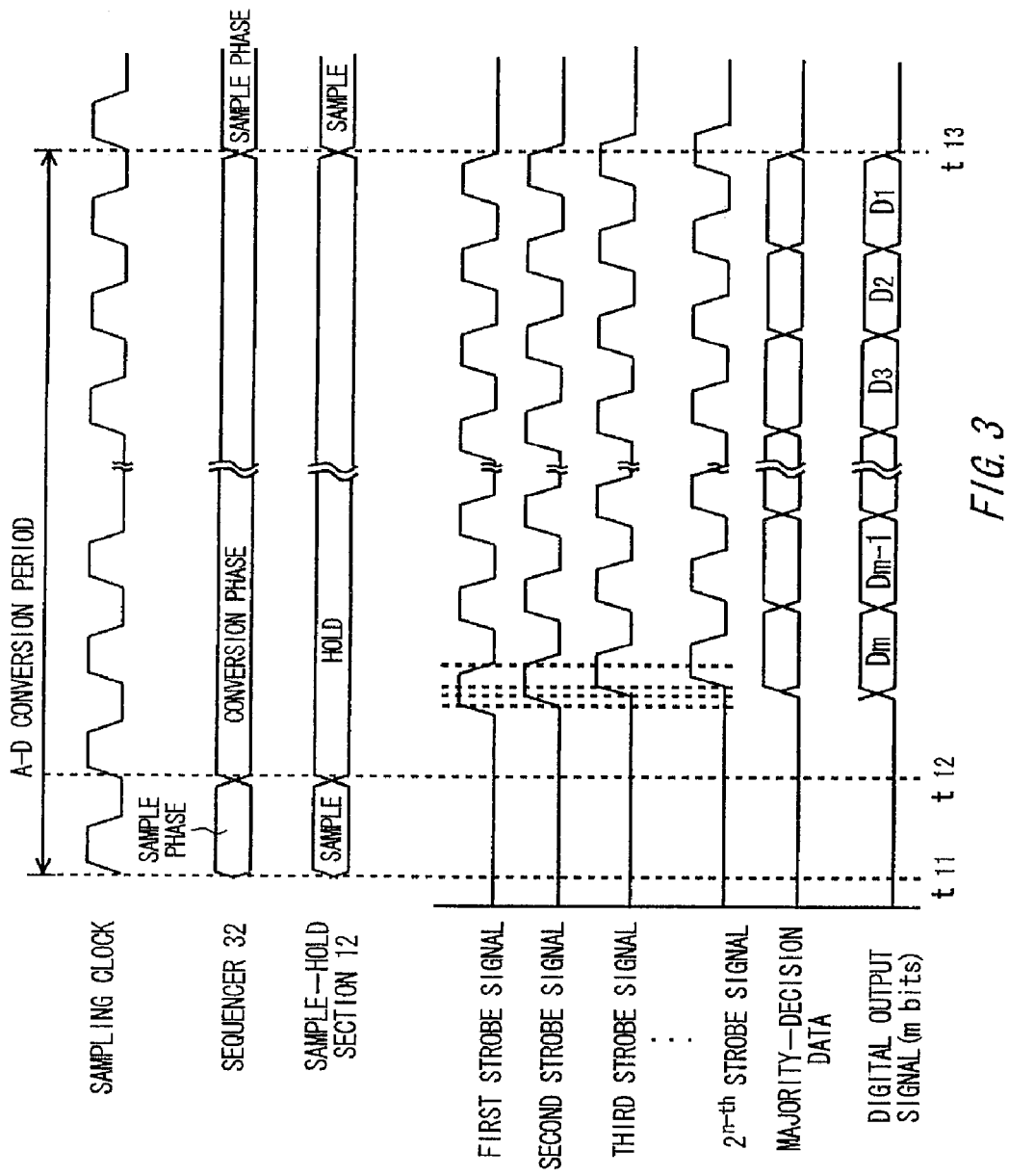
FIG. 3 is a timing chart exemplary showing an analog-to-digital conversion process by an A/D converter 10 according to an embodiment of the present invention.

FIG. 2 shows a flow of an analog-to-digital conversion process by the A/D converter 10 according to the present embodiment. FIG. 3 is a timing chart exemplary showing the analog-to-digital conversion process by the A/D converter 10 according to the present embodiment.

When the analog-to-digital conversion process is started, the sequencer 32 first repeats a process from step S12 to step S19 every analog-to-digital conversion period (S11 and S20, t11 to t13).

In each analog-to-digital conversion period, the sequencer 32 first instructs the sample-hold section 12 to perform sampling (S12, t11) by controlling the sample-hold signal. Upon receiving sampling instruction from the sequencer 32, the sample-hold section 12 samples the analog input signal (t11 to t12). The sequencer 32 instructs the sample-hold section 12 to hold the sampled signal at a timing at which the sampling is completed (t13). Upon receiving hold instruction from the sequencer 32, the sample-hold section 12 holds the sampled analog input signal (t12 to t13). The sequencer 32 continues the hold instruction until the analog-to-digital conversion period is finished (t13).

Next, the sequencer 32 operates the bit selecting section 18. Upon receiving operation initiation instruction from the sequencer 32, the bit selecting section 18 sequentially selects, in synchronization with the sampling clock, the conversion object bits one-by-one from the most significant bit to the least significant bit within a field of the digital output signal (S13 and S18, t12 to t13). In each of time intervals selecting the conversion object bits, the bit selecting section 18 performs the processes from step S14 to step S17.

In each of time intervals selecting the conversion object bits, the threshold-value controlling section 20 determines a threshold data expressing a boundary value between zero and one of a conversion object bit based on an already-determined value of higher-order bits than the conversion object bit (S14). Next, the D/A converting section 22 supplies in common to each of the n comparators 50 an analog threshold value that is obtained by digital-to analog converting the threshold data (S15).

Next, the sequencer 32 instructs the timing controlling section 30 to supply the strobe signals (S16, t12 to t13). Upon receiving the strobe-signal supplying instruction, the timing controlling section 30 respectively supplies to the n comparators 50 the first to the nth strobe signals of which each is deviated from the other by an interval not more than the period of the sampling clock. Then, each of the n comparators 50 compares the analog input signal held by the sample-hold section 12 and the analog threshold value supplied from the D/A converting section 22 at the timing specified by the corresponding strobe signal.

Next, the bit determining section 26 determines the value (zero or one) of the conversion object bit by referring to the comparison results performed by the n comparators 50 using, for example, majority decision (S17). When the processes of S14 to S17 have been completed for all bits from the most significant bit to the least significant bit, the bit determining section 26 can determine a data value of the digital output signal corresponding to one sample.

Next, after the data value has been determined, the sequencer 32 instructs the storing section 28 to output the digital output signal (for example, the next analog-to-digital conversion period) (S19). Upon receiving the output instruction by the sequencer 32, the storing section 28 outputs the data value of the whole field of the digital output signal corresponding to one sample, which is determined in step S17. Then, the A/D converter 10 can output time-series digital output signals according to analog input signals by repeating the processes of the above S12 to S19.

Figure 4:
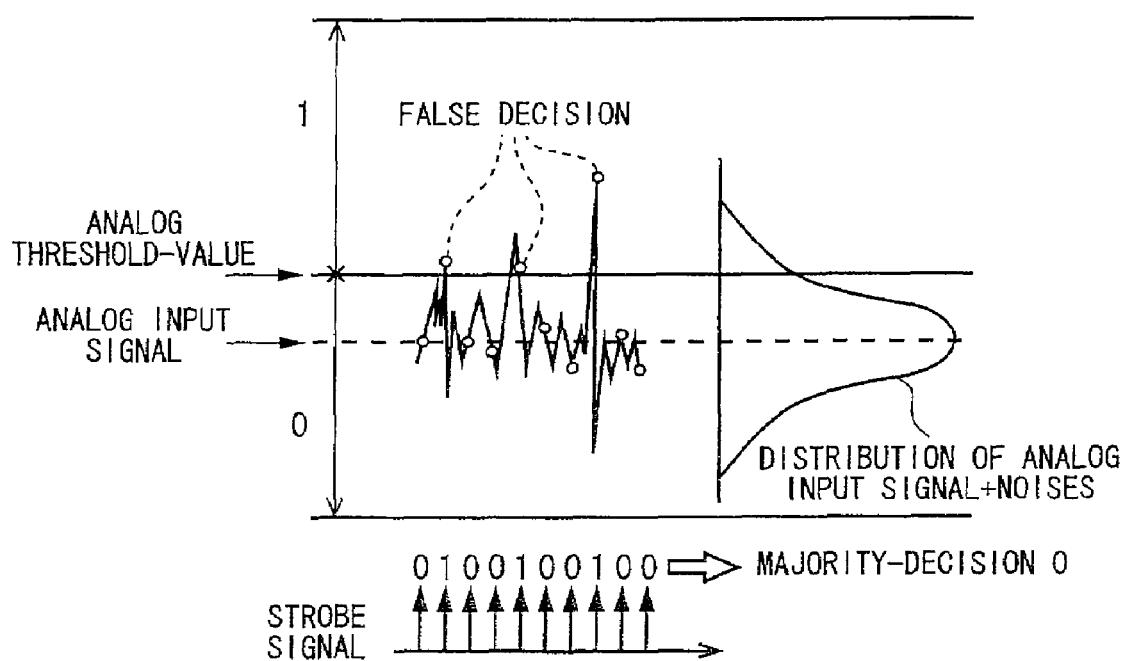
FIG. 4 is a view exemplary showing a distribution and a plurality of comparison timings of an analog input signal and noises that are input into a comparing section 24 according to an embodiment of the present invention.
Figure 5:
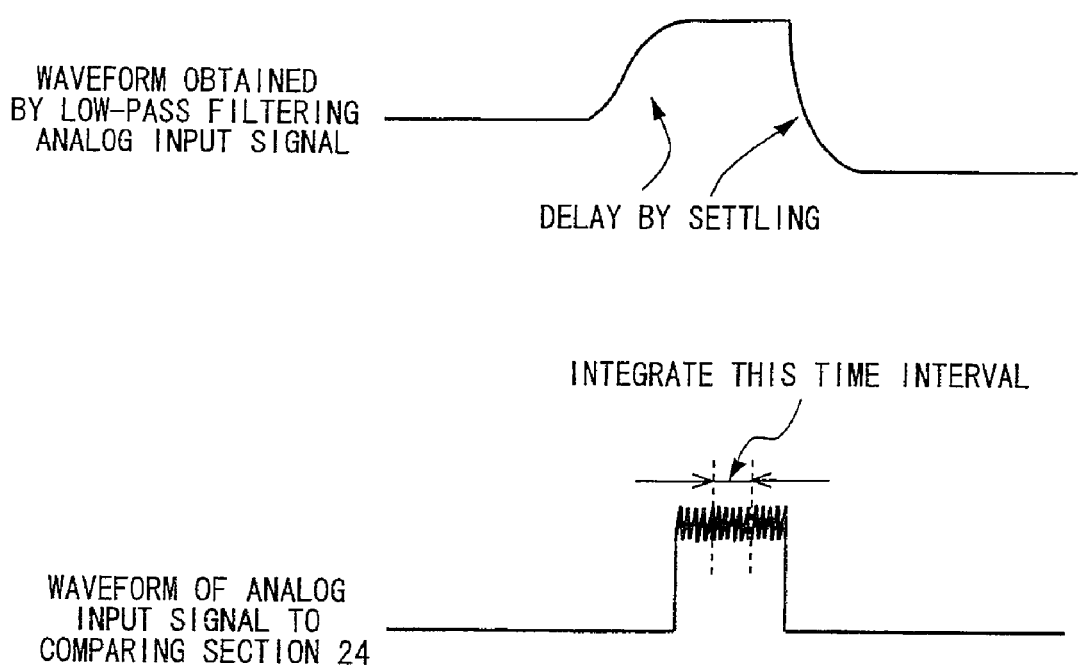
FIG. 5 is a view exemplary showing a waveform obtained by low-pass filtering an analog input signal and a waveform obtained without low-pass filtering the analog input signal that is input into a comparing section 24 according to an embodiment of the present invention.

FIG. 4 is a view exemplary showing a distribution and a plurality of comparison timings of the analog input signal and noises that are input into the comparing section 24 according to the present embodiment. FIG. 5 is a view exemplary showing a waveform obtained by low-pass filtering the analog input signal and a waveform obtained without low-pass filtering the analog input signal that are input into the comparing section 24 according to the present embodiment.

The analog input signal input into the A/D converter 10 may include thermal noise that has a form of Gaussian distribution as shown in FIG. 4. When including thermal noise, large noises are rarely overlapped on the analog input signal. Here, when large noises are generated at that timing specified by the strobe signal, the comparing section 24 may output an incorrect comparison result. Since a successive-approximation type A/D converter sequentially determines values from a high-order bit, the converter outputs a data value including gross errors when a false decision is performed on the high-order bit.

Moreover, it is conceivable to low-pass filter an analog input signal in order to solve such a problem. However, as shown in FIG. 5, the low-pass filtered analog input signal is delayed by settling, and thus a conversion time gets longer.

On the other hand, according to the A/D converter 10 of the present embodiment, since the plurality of comparison results compared at different comparison timings is used by, for example, majority decision, it is possible to obtain a correct decision result without an influence by instantaneous large noises with a few event probability. Furthermore, the A/D converter 10 can obtain a result equal to a data value obtained by analog-to-digital converting an integral waveform of an analog input signal without delaying the analog input signal as shown in FIG. 5. As described above, the A/D converter 10 according to the present embodiment can realize analog-to-digital conversion with high precision in a short conversion time.

In addition, as an example, the comparing section 24 may determine the plurality of timings in the conversion time interval determining the value of the conversion object bit on the basis of a random number. According to this, although there are period noises that are generated in synchronization with the sampling clock, the comparing section 24 can remove an influence of a false decision by the period noises. For example, the timing controlling section 30 may change delay times between the first to the nth strobe signals that are supplied to the n comparators 50 in accordance with a random number. According to this, the comparing section 24 can determine the plurality of timings in the conversion time interval on the basis of the random number.

Moreover, the timing controlling section 30 may lengthen a conversion time interval for a predetermined bit of the digital output signal in comparison with a conversion time interval of a higher-order bit than the predetermined bit. For example, the timing controlling section 30 may set a conversion time interval of the least significant bit to a time obtained by multiplying a conversion time interval of the most significant bit in the low-order field by two. According to this, the timing controlling section 30 can analog-to-digital convert with high precision a value of the low-order bit in which a margin of a signal to noises becomes smaller.

Figure 6:
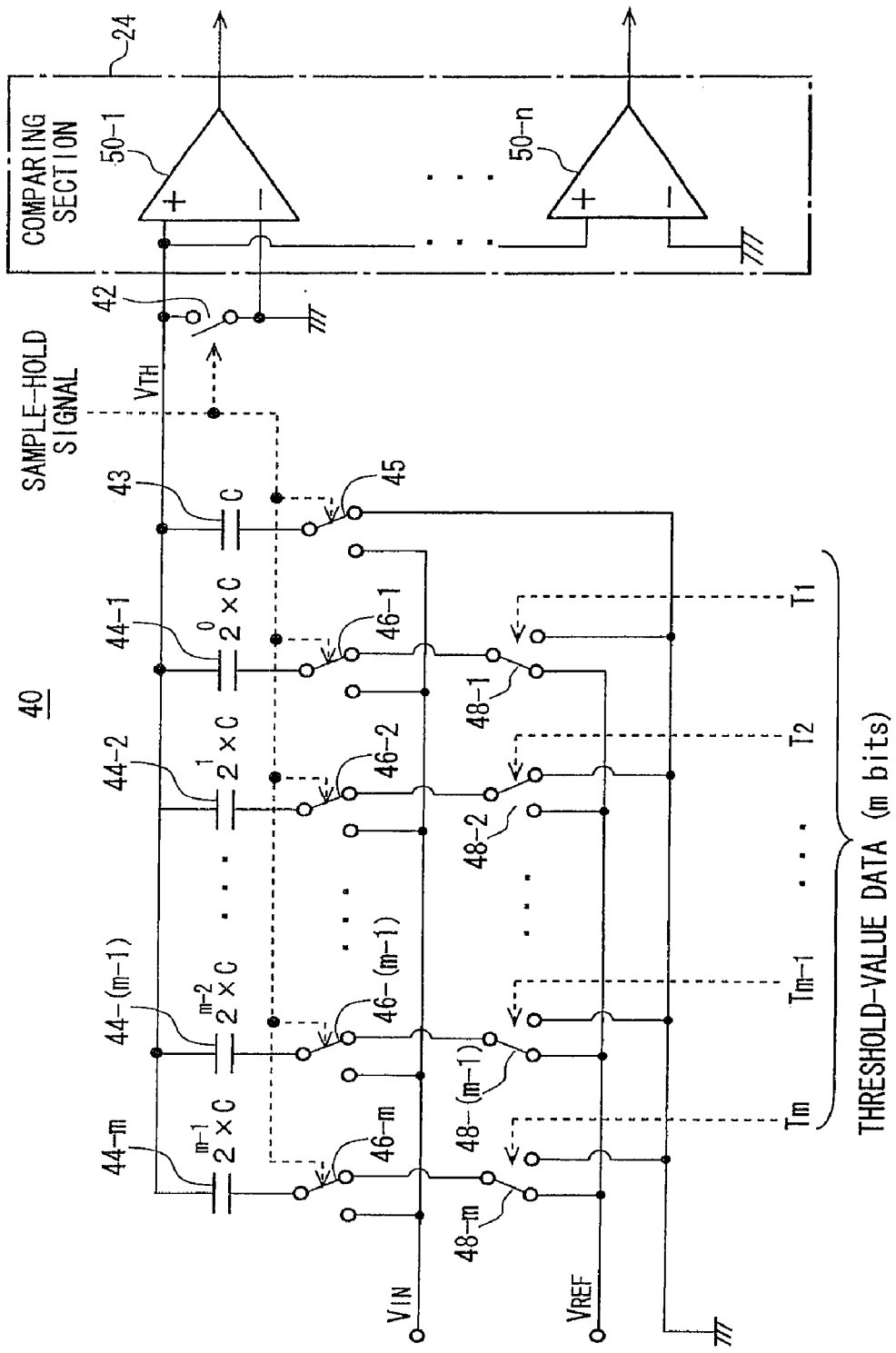
FIG. 6 shows a configuration of a charge-redistribution type D/A converter 40 according to a first alternative example of an embodiment of the present invention along with a comparing section 24.

FIG. 6 shows a configuration of a charge-redistribution type D/A converter 40 according to a first alternative example of the present embodiment along with the comparing section 24. Since the A/D converter 10 according to the present alternative example has the substantially same configuration and function as those of the A/D converter 10 according to the present embodiment shown in FIG. 1, their descriptions will be omitted except the following differences.

The A/D converter 10 according to the present alternative example includes a charge-redistribution type D/A converter 40 shown in FIG. 6 in place of the sample-hold section 12 and the D/A converting section 22 shown in FIG. 1. The charge-redistribution type D/A converter 40 has a function of the sample-hold section 12 and a function of the D/A converting section 22.

In the present alternative example, each minus input terminal of the plurality of comparators 50 is connected to a ground. Each of the plurality of comparators 50 outputs High logic (one) when a voltage applied to a plus input terminal is not less than a voltage (ground potential) applied to a minus input terminal, and outputs Low logic (zero) when the applied voltage of the plus input terminal is less than the voltage (ground potential) applied to the minus input terminal.

The charge-redistribution type D/A converter 40 has a sample switch 42, an adjustment capacitor 43, a first to an m-th capacitors 44-1 to 44-$m$, an adjustment switch 45, a first to an m-th input change-over switches 46-1 to 46-$m$, and a first to an m-th bit switches 48-1 to 48-$m$. In addition, in FIG. 6, m is the number of bits (an integer number of two or more) of the threshold data.

The sample switch 42 connects the plus input terminal of each comparator 50 to the ground when a sample is specified by a sample-hold signal, and opens between the plus input terminal of each comparator 50 and the grand when a hold is specified by the sample-hold signal.

The adjustment capacitor 43 has a capacity of a predetermined value C. One end of the adjustment capacitor 43 is connected to the plus input terminal of each comparator 50.

The first to the m-th capacitors 44-1 to 44-$m$ respectively correspond to the m bits of the threshold data in order. In other words, the first capacitor 44-1 corresponds to the first bit (the least significant bit) from a low-order position, the second capacitor 44-2 corresponds to the second bit from the low-order position, the third capacitor 44-3 corresponds to the third bit from the low-order position, and similarly the m-th capacitor 44-$m$ corresponds to the m-th bit (the most significant bit) from the low-order position. The first capacitor 44-1 has a capacity of $2^0 \ast C$ that is obtained by multiplying a predetermined value C by $2^0$ (one), the second capacitor 44-2 has a capacity of $2^1 \ast C$ that is obtained by multiplying the predetermined value C by $2^1$, the third capacitor 44-3 has a capacity of $2^2 \ast C$ that is obtained by multiplying the predetermined value C by $2^2$, and similarly the m-th capacitor 44-$m$ has a capacity of $2^{m-1} \times C$ that is obtained by multiplying the predetermined value C by $2^{m-1}$. One end of each of the first to the m-th capacitors 44-1 to 44-$m$ is connected to the plus input terminal of each comparator 50.

When the sample is specified by the sample-hold signal, the adjustment switch 45 applies the analog input signal $V_{IN}$ to a terminal (hereinafter, referred to as the other end of the adjustment capacitor 43) of the adjustment capacitor 43 that is not connected to the plus input terminal of each comparator 50. When the hold is specified by the sample-hold signal, the adjustment switch 45 applies the ground potential to the other end of the adjustment capacitor 43.

The first to the m-th input change-over switches 46-1 to 46-$m$ respectively correspond to the first to the m-th capacitors 44-1 to 44-$m$. When the sample is specified by the sample-hold signal, the first to the m-th input change-over switches 46-1 to 46-$m$ apply the analog input signal $V_{IN}$ to each terminal (hereinafter, referred to as the other end of the first to the m-th capacitors 44-1 to 44-$m$) of the first to the m-th capacitors 44-1 to 44-$m$ that is not connected to the plus input terminal of each comparator 50. When the hold is specified by the sample-hold signal, the first to the m-th input change-over switches 46-1 to 46-$m$ apply the reference signal $V_{REF}$ or the ground potential to the other ends of the first to the m-th capacitors 44-1 to 44-$m$.

The first to the m-th bit switches 48-1 to 48-$m$ respectively correspond to the m bits of the threshold data in order. In other words, the first bit switch 48-1 corresponds to the first bit (the least significant bit) from the low-order position, the second bit switch 48-2 corresponds to the second bit from the low-order position, the third bit switch 48-3 corresponds to the third bit from the low-order position, and similarly the m-th bit switch 48-$m$ corresponds to the m-th bit (the most significant bit) from the low-order position. When the corresponding bit of the threshold data is High logic (one), each of the first to the m-th bit switches 48-1 to 48-$m$ applies the reference signal $V_{REF}$ to the other end of the corresponding first to m-th capacitors 44-1 to 44-$m$. When the corresponding bit of the threshold data is Low logic (zero), each of the first to the m-th bit switches 48-1 to 48-$m$ applies the ground potential to the other end of the corresponding first to m-th capacitors 44-1 to 44-$m$.

In the charge-redistribution type D/A converter 40 with such a configuration, one end of each of the adjustment capacitor 43 and the first to the m-th capacitors 44-1 to 44-$m$ is connected to the ground during, and the other end of each is applied with the voltage value $V_{IN}$ of the analog input signal, during sampling. Therefore, the adjustment capacitor 43 and the first to the m-th capacitors 44-1 to 44-$m$ can sample the voltage value $V_{IN}$ of the analog input signal during sampling.

Moreover, the charge-redistribution type D/A converter 40 with such a configuration opens the connection between one end of the adjustment capacitor 43 and the ground and stops applying the voltage value $V_{IN}$ of the analog input signal to the other end, during holding. Therefore, the adjustment capacitor 43 applies a backward voltage ($-V_{IN}$) of the voltage $V_{IN}$ of the held analog input signal to the plus input terminal of each comparator 50 during holding.

Additionally, the charge-redistribution type D/A converter 40 with such a configuration opens the connection between one end of each of the first to the m-th capacitors 44-1 to 44-$m$ and the ground during holding. In each of the first to the m-th capacitors 44-1 to 44-$m$, the other is applied with the voltage $V_{REF}$ when the corresponding bit value of the threshold data is High logic (one) and the other is applied with the ground potential when the corresponding bit value of the threshold data is Low logic (zero), during holding.

Therefore, during holding, each of the adjustment capacitor 43 and the first to the m-th capacitors 44-1 to 44-$m$ can apply a voltage $V_{TH}$ shown in the following Expression (1) to the plus input terminal of each comparator 50.

$$V_{TH} = -V_{IN} + \{(V_{REF}/2^1) \times (T_m) + (V_{REF}/2^2) \times (T_{m-1}) + \ldots + (V_{REF}/2^{m-1}) \times (T_2) + (V_{REF}/2^m) \times (T_1)\} \quad (1)$$

In Expression (1), $T_1$ shows the first-bit (the least significant bit) logical value from the low-order position of the threshold data, $T_2$ shows the second-bit logical value from the low-order position of the threshold data, and similarly $T_m$ shows the m-th bit logical value (the most significant bit) from the low-order position of the threshold data.

The voltage $V_{TH}$ shown in Expression (1) becomes not less than the ground potential (0V) if the voltage value $V_{IN}$ of the analog input signal is not less than a threshold voltage (a voltage expressed by expression surrounded with braces { } in Expression (1)) according to the threshold data. Moreover, the voltage $V_{TH}$ becomes less than the ground potential (0V) if the voltage value $V_{IN}$ of the analog input signal is less than the threshold voltage according to the threshold data.

Then, each comparator 50 outputs a logical value showing a comparison result between the ground potential and the voltage $V_{TH}$. In other words, each comparator 50 outputs Low logic (zero) when the voltage $V_{TH}$ of Expression (1) is not less than the ground potential and outputs High logic (one) when the voltage $V_{TH}$ of Expression (1) is less than the ground potential.

The charge-redistribution type D/A converter 40 with such a configuration can cause each of the plurality of comparators 50 to compare the voltage value $V_{IN}$ of the analog input signal and the voltage value according to the threshold data. The charge-redistribution type D/A converter 40 with such a configuration can further sample and hold the voltage value $V_{IN}$ of the analog input signal. According to this, the A/D converter 10 according to the present alternative example may have a simple configuration without including the sample-hold section 12.

Furthermore, since a capacity of each of the capacitors 44 becomes small when the A/D converter 10 according to the present alternative example performs sampling in the same capacity as in the case of including the sample-hold section 12, a time constant becomes small and thus a sampling time can be shortened. Moreover, since noises included in the plurality of capacitors 44 are averaged when each of the capacitors 44 samples the analog input signal with precision equal to that of the sample-hold section 12, the A/D converter 10 according to the present alternative example can perform analog-to-digital conversion with high precision.

Figure 7:
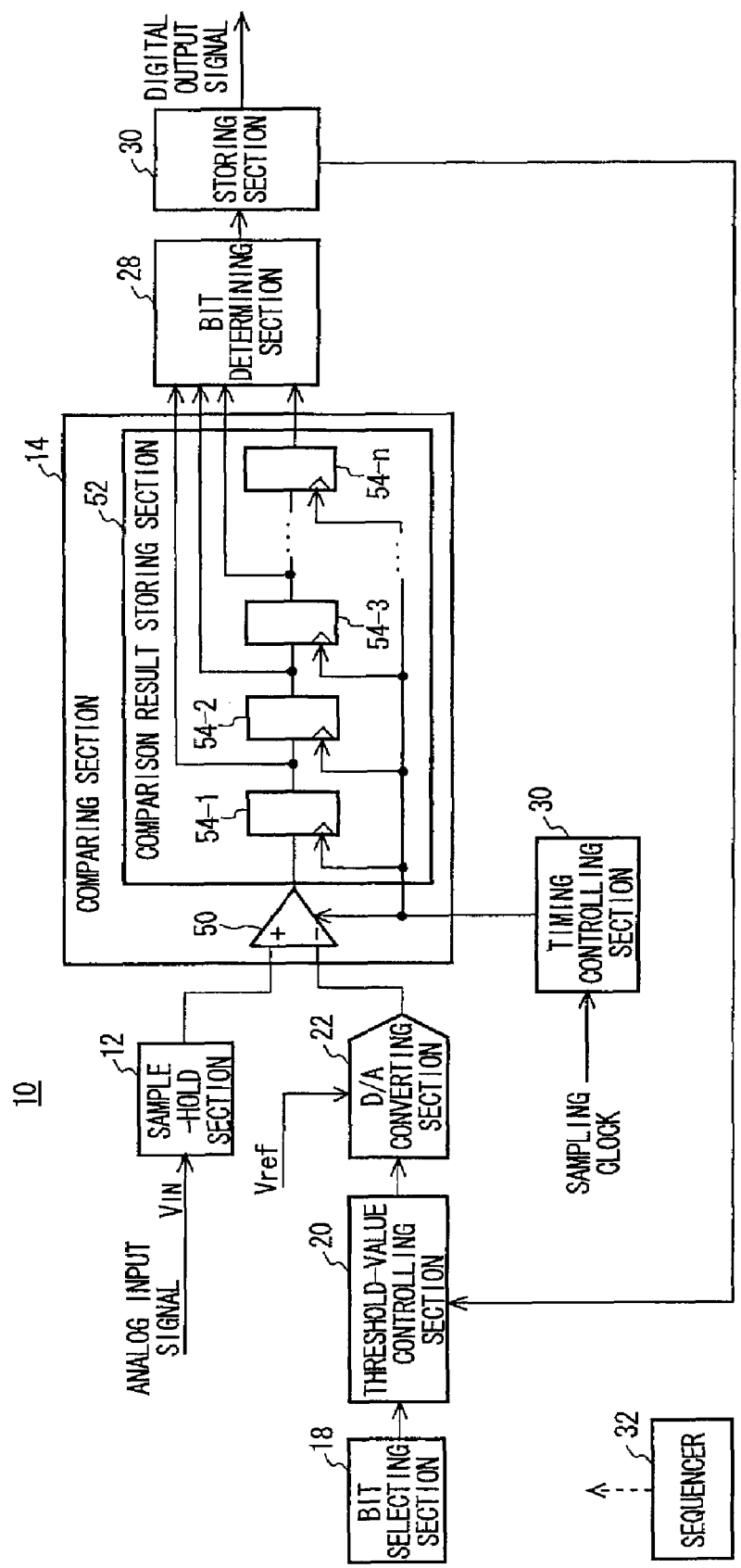
FIG. 7 shows a configuration of an A/D converter 10 according to a second alternative example of an embodiment of the present invention.

FIG. 7 shows a configuration of an A/D converter 10 according to a second alternative example of the present embodiment. Since the A/D converter 10 according to the present alternative example has the substantially same configuration and function as those of the A/D converter 10 according to the present embodiment shown in FIG. 1, elements having the substantially same configuration and function as those of elements shown in FIG. 1 have the same reference number so as to omit their descriptions except the following differences.

The timing controlling section 30 according to the present alternative example generates strobe signals specifying the plurality of timings in a conversion time interval for one bit of the digital output signal. As an example, the timing controlling section 30 may output strobe signals that are obtained by multiplying a frequency of a sampling clock by a predetermined number by means of a PLL circuit.

The comparing section 24 according to the present alternative example has a comparator 50 and a comparison result storing section 52. The comparison result storing section 52 compares the analog input signal and the analog threshold value at a timing designated by a strobe signal.

The comparison result storing section 52 includes one or more registers 54-1 to 54-$n$ that are serially connected to one another. The first-stage register 54-1 acquire and stores the comparison result by the comparator 50 at the timing specified by the strobe signal. The registers 54-2 to 54-$n$ after the second stage acquire and store the comparison results that are respectively stored on the preceding-stage registers 54-1 to 54-$(n-1)$ at the timing specified by the strobe signal. According to this, the comparison result storing section 52 can store the plurality of comparison results which are obtained by comparing the analog input signal and the analog threshold value at the plurality of different timings in the conversion time interval determining the value of the conversion object bit.

The storing section 28 according to the present alternative example determines the value of the conversion object bit on the basis of the comparison results at the plurality of timings stored on the comparison result storing section 52. The A/D converter 10 according to the present alternative example as described above can realize analog-to-digital conversion with high precision in a short conversion time, similarly to the A/D converter 10 shown in FIG. 1. Furthermore, since the A/D converter 10 outputs the comparison results at the plurality of timings by means of one comparator 50, the A/D converter 10 can be realized with a simple configuration.

In addition, in the present alternative example, the timing controlling section 30 may increase the number of timings in a conversion time interval of a predetermined bit of the digital output signal, in comparison with the number of timings in a conversion time interval of a higher-order bit than the predetermined bit. As an example, when a conversion object bit is a lower-order bit than the predetermined bit, the timing controlling section 30 may increase the number of timings specified in a conversion time interval of the conversion object bit, in comparison with the number of timings specified in the conversion time interval of the predetermined bit. According to this, the timing controlling section 30 can decide a value of the low-order bit, in which a margin of a signal to noises becomes smaller, by majority decision on the basis of more comparison results. As a result, the A/D converter 10 can perform analog-to-digital conversion with high precision.

Figure 8:
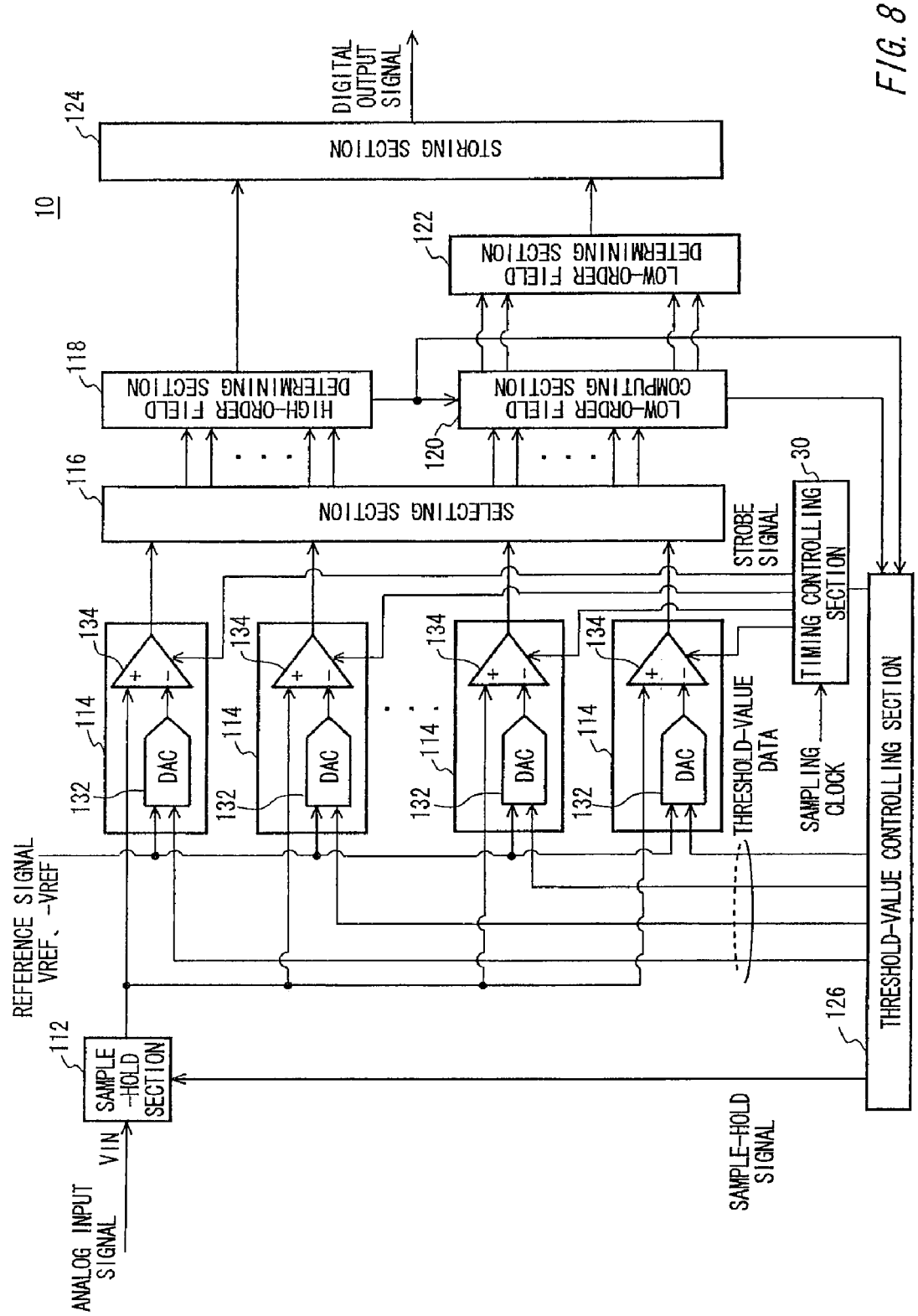
FIG. 8 shows a configuration of an A/D converter 10 according to a third alternative example of an embodiment of the present invention.

FIG. 8 shows a configuration of an A/D converter 10 according to a third alternative example of an embodiment of the present invention. Since the A/D converter 10 according to the present alternative example has the substantially same configuration and a function as those of the A/D converter 10 according to the present embodiment shown in FIG. 1, their descriptions will be omitted except the following differences.

The A/D converter 10 according to the present alternative example includes a sample-hold section 112, a plurality of comparators 114, a selecting section 116, a high-order field determining section 118, a low-order field computing section 120, a low-order field determining section 122, a storing section 124, a threshold-value controlling section 126, and a timing controlling section 30. The sample-hold section 112 samples an analog input signal in accordance with a sample-hold signal, and holds the sampled analog input signal. As an example, the sample-hold section 112 may sample a voltage value $V_{IN}$ of the analog input signal by means of a capacitor, and hold the voltage value $V_{IN}$ of the analog input signal sampled by the capacitor for a certain period.

Each of the plurality of comparators 114 compares the analog input signal held by the sample-hold section 112 and the analog threshold value according to the digital threshold data specified by the threshold-value controlling section 126. As an example, each of the plurality of comparators 114 may specify a threshold voltage using the threshold data having the number of bits (for example, m bits (m is an integer number of two or more)) equal to that of the data value of the digital output signal, and compare the specified threshold voltage and the voltage value $V_{IN}$ of the analog input signal. In this case, as an example, each of the plurality of comparators 114 may have a DAC 132 and a comparing circuit 134. The DAC 132 outputs one voltage among a plurality of voltages obtained by dividing an interval between a voltage value of a reference signal and a ground by $2^m$ steps at a substantially equal interval, in accordance with the specified threshold data. The comparing circuit 134 compares the voltage value $V_{IN}$ of the analog input signal held by the sample-hold section 112 and the threshold voltage output from the DAC 132. In the present embodiment, the comparator 114 outputs Low logic (zero) when generating a comparison result in which the analog input signal is not less than the analog threshold value according to the threshold data, and outputs High logic (one) when generating a comparison result in which the analog input signal is less than the analog threshold value according to the threshold data.

The selecting section 116 supplies the plurality of comparison results respectively output from the plurality of comparators 114 to the high-order field determining section 118 and the low-order field computing section 120. The high-order field determining section 118 narrows down a data value corresponding to a high-order field for the predetermined number of bits in the digital output signal, on the basis of the plurality of comparison results obtained by supplying the threshold data different from one another to the plurality of comparators 114.

The low-order field computing section 120 computes, by means of the plurality of comparators 114, a plurality of candidate values of a data value corresponding to a low-order field for the predetermined number of bits located at a side lower than the high-order field. As an example, the low-order field computing section 120 may compute in parallel candidate values of the data value corresponding to the low-order field by means of a plurality of groups obtained by dividing the plurality of comparators 114. The low-order field determining section 122 determines the data value corresponding to the low-order field on the basis of the plurality of candidate values.

The storing section 124 stores the data values for the high-order field and the low-order field of the digital output signal that is determined by the high-order field determining section 118 and the low-order field determining section 122. The threshold-value controlling section 126 outputs the threshold data to be respectively specified for the plurality of comparators 114 in accordance with the control of the high-order field determining section 118 and the low-order field computing section 120. The threshold-value controlling section 126 further outputs strobe signals by which the plurality of comparators 114 specifies comparison timings and a sample-hold signal by which the sample-hold section 112 specifies a sample timing and a hold timing of the analog input signal.

The timing controlling section 30 respectively supplies the strobe signals to the plurality of comparators 114, and controls the comparison timings at which the plurality of comparators 114 respectively compares the analog input signal and the analog threshold value. For more detail, the timing controlling section 30 causes the first comparator 114 among the plurality of comparators 114 to compare the analog input signal and the analog threshold value at the first timing in the conversion time interval determining a value for one bit, when computing the plurality of candidate values for the data value corresponding to the low-order field. Furthermore, the timing controlling section 30 causes the second comparator 114 among the plurality of comparators 114 to compare the analog input signal and the analog threshold value at the second timing different from the first timing in the conversion time interval. According to this, the timing controlling section 30 can reduce an influence of a false decision of the comparator 114 by instantaneous noises and thus compute the plurality of candidate values of the data value corresponding to the low-order field with high precision.

As an example, the timing controlling section 30 may delay a sampling clock determining a conversion time interval for one bit by means of a delay element having a delay amount less than one period of this sampling clock, in order to generate the first strobe signal specifying the first comparison timing and the second strobe signal specifying the second comparison timing. In this case, the first comparator 114-1 compares the analog input signal and the analog threshold value according to the first strobe signal. Moreover, the second comparator 114-2 compares the analog input signal and the analog threshold value according to the second strobe signal. According to this, the timing controlling section 30 can generate the plurality of strobe signals of which each is deviated from the other at an interval not more than a period of the sampling clock determining the conversion time interval for one bit.

Moreover, the timing controlling section 30 may supply in parallel the plurality of strobe signals, of which each is deviated from the other at an interval not more than the period of the sampling clock, to the plurality of comparators 114 when computing the plurality of candidate values for the data value corresponding to the low-order field. Furthermore, the timing controlling section 30 may supply a common strobe signal specifying the generally same comparison timing to the plurality of comparators 114 when determining the data value corresponding to the high-order field.

In addition, since it is enough that a high-order field is located at a high-order bit relatively compared to a low-order field, the high-order field is not limited to a high-order side field among areas obtained by dividing all bits of the digital output signal. Similarly, since it is enough that a low-order field is located at a low-order bit relatively compared to a high-order field, the low-order field is not limited to a low-order side field among areas obtained by dividing all bits of the digital output signal.

Figure 9:
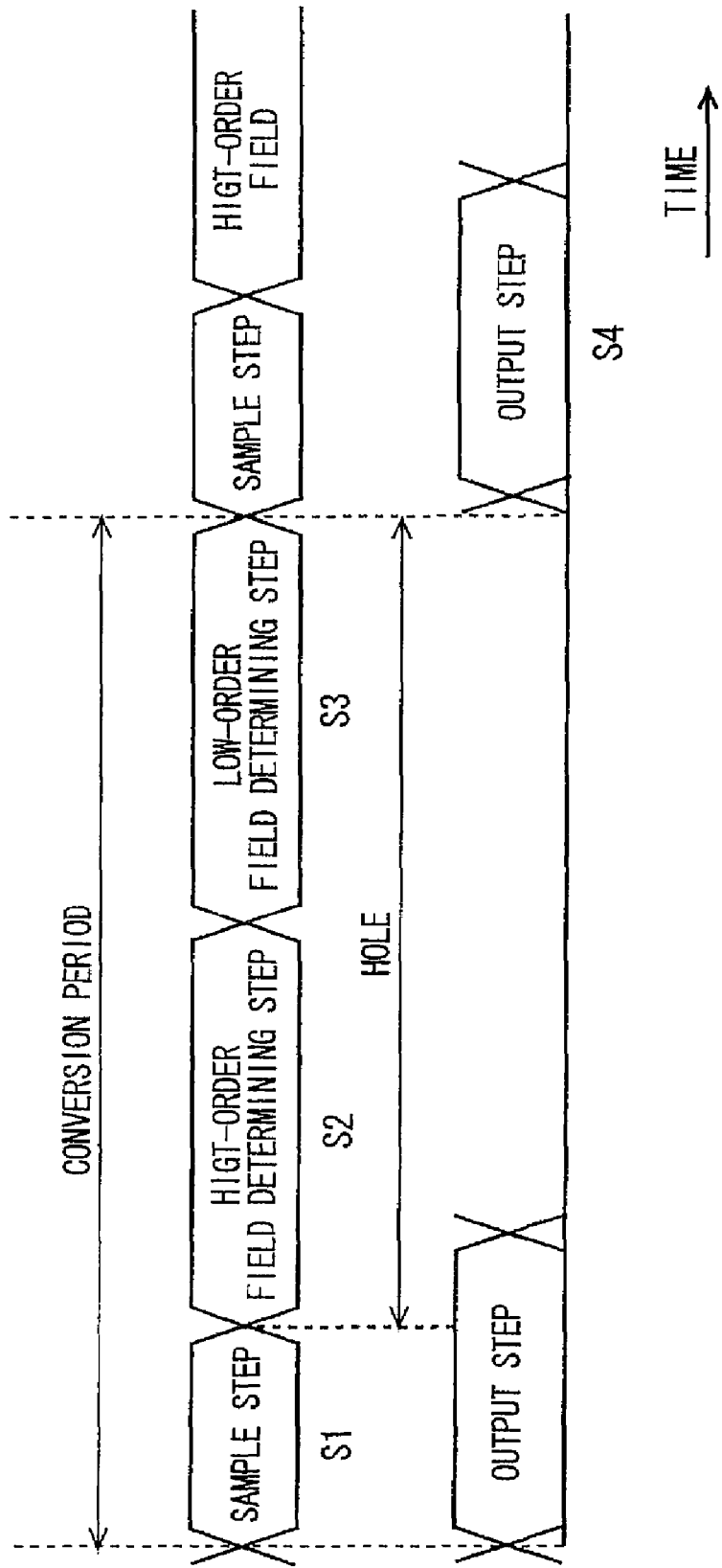
FIG. 9 shows each step of an analog to digital process by an A/D converter 10 according to the third alternative example.

FIG. 9 shows each step of an analog to digital process by the A/D converter 10 according to the present embodiment.

First, the A/D converter 10 samples an analog input signal in a sample step (S1). The A/D converter 10 holds the sampled analog input signal after completing sampling until completing a high-order field determining step (S2) and a low-order field determining step (S3).

Next, in the high-order field determining step (S2), the A/D converter 10 determines a data value corresponding to a high-order field of the digital output signal by performing at least one determination phase (high-order determination phase) in which the data value is determined by a multiple-bit conversion process using the plurality of comparators 114. Next, in the low-order field determining step (S3), the A/D converter 10 computes a plurality of candidate values for a data value corresponding to a low-order field of the digital output signal by concurrently executing a successive approximation process several times, and determines one data value on the basis of the plurality of candidate values. Next, in an output step (S4), the A/D converter 10 outputs a data value for all fields of the digital output signal determined in the high-order field determining step (S2) and the low-order field determining step (S3).

The A/D converter 10 repeats the steps of S1 to S4 every conversion period. According to this, the A/D converter 10 can output a data value which is obtained by converting an analog input signal into a digital value every conversion period. In addition, the A/D converter 10 may perform the sample step (S1), the high-order field determining step (S2), and the low-order field determining step (S3) within one conversion period, and perform the output step (S4) outputting a data value converted in this conversion period after this conversion period.

Figure 10:
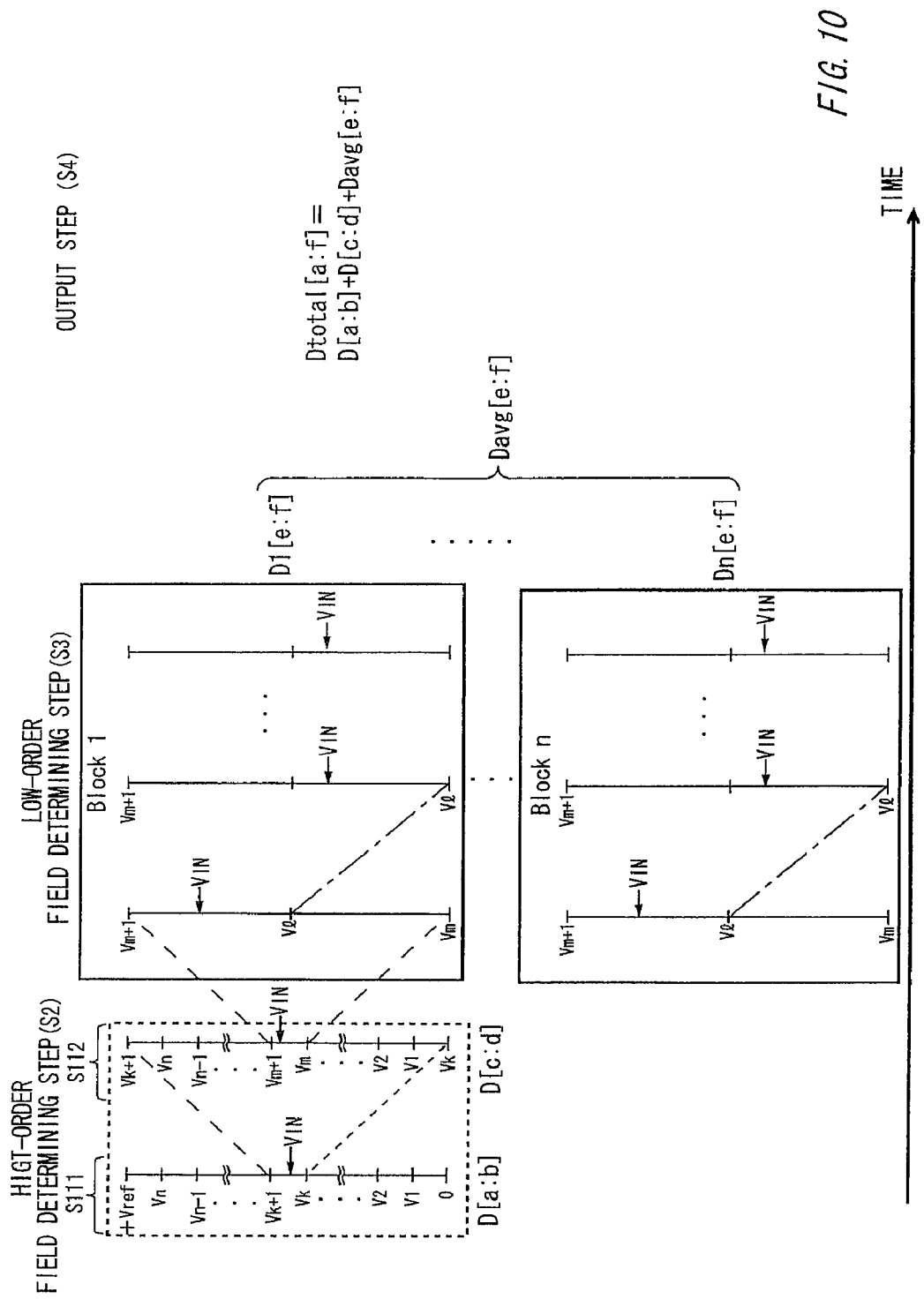
FIG. 10 is a view exemplary showing a conversion process by an A/D converter 10 when causing a plurality of comparators 14 to execute a multiple-bit conversion process in a high-order field determining step (S2) and causing each of the plurality of comparators 14 to execute a successive approximation process in a low-order field determining step (S3).

FIG. 10 is a view exemplary showing a conversion process by the A/D converter 10 when causing the plurality of comparators 14 to execute a multiple-bit conversion process in the high-order field determining step (S2) and causing each of the plurality of comparators 14 to execute a successive approximation process in the low-order field determining step (S3).

In addition, as an example, FIG. 10 shows the case that it is assumed that a<b<c<d<e<f (here, a to f are an integer number of one or more), a data value (D[a:b]) of the a-th and b-th bits from high order and a data value (D[c:d]) of the c-th and d-th bits from high order in the digital output signal are respectively determined in the high-order field determining step (S2), and a data value (Davg[e:f]) of the e-th and f-th bits from high order in the digital output signal is determined in the low-order field determining step (S3). Moreover, in this case, the number of bits of the threshold data is equal to that of the digital output signal. Moreover, in FIG. 10, a dotted line linking a tick mark showing a threshold value in S1 and a tick mark showing a threshold value in S112 is an equivalent threshold value. In FIG. 10, a dotted line between S112 and S3 is also similar.

As an example, in the high-order field determining step (S2), the high-order field determining section 118 may perform by multiple times a determination phase (high-order determination phase) in which a data value is determined by a multiple-bit conversion process using the plurality of comparators 114, in order to determine a data value corresponding to a high-order field of the digital output signal. As an example, as shown in FIG. 10, the high-order field determining section 118 may determine the data value (D[a:b]) of the a-th and b-th bits in the first high-order determination phase (S111), and then determine the data value (D[c:d]) of the c-th and d-th bits in the second high-order determination phase (S112).

In the first high-order determination phase (S111), the high-order field determining section 118 controls the threshold-value controlling section 126 to supply in parallel threshold data having different data values corresponding to the high-order field to the plurality of comparators 114. As an example, in the first high-order determination phase (S111), the high-order field determining section 118 may supply in parallel to the plurality of comparators 114 threshold data in which data values of the a-th and b-th bits are different from each other and the other bits are the same as one another (for example, zero). As an example, the high-order field determining section 118 may supply in parallel threshold data different from one another to the plurality of comparators 114, in order to generate $2^{(b-a+1)}$ pieces of threshold voltage, which are obtained by substantially equally dividing a range, for example, above 0V and below $+V_{REF}$ by $2^{(b-a+1)}$ steps, from the plurality of comparators 114.

In the first high-order determination phase (S111), each of the plurality of comparators 114 supplied with the threshold data compares whether the analog input signal is not less than an analog value according to the corresponding threshold data. The high-order field determining section 118 narrows down a data value of a high-order field to a data value between the maximum of the threshold data in which the analog input signal is not less than the analog value according to this threshold data and the minimum of the threshold data in which the analog input signal is less than the analog value according to this threshold data, on the basis of the comparison results by the plurality of comparators 114. As an example, the high-order field determining section 118 may determine a data value of a high-order field in the digital output signal to a value of a high-order field in the maximum of the threshold data in which the analog input signal is not less than the analog value according to this threshold data. In the present example, the high-order field determining section 118 may determine a data value of the a-th and b-th bits in the digital output signal to a data value of the a-th and b-th bits of the maximum of the threshold data in which the analog input signal is not less than the analog value according to this threshold data.

Next, in the second high-order determination phase (S112), the high-order field determining section 118 controls the threshold-value controlling section 126 to supply in parallel to the plurality of comparators 114 a threshold data in which data values corresponding to the high-order field to be determined in this phase are different from one another and the other bits are the same as one another. In this case, the high-order field determining section 118 supplies a threshold data in which a value of the field of which a data value is determined till the preceding phase is set to this determined data value. As an example, the high-order field determining section 118 may supply in parallel to the plurality of comparators 114 a threshold data in which the a-th and b-th bits are set to data values determined in the first high-order determination phase (S111), the c-th and d-th bits are set to data values different from each other, and the e-th and f-th bits are set to the same data value (for example, zero).

As an example, the high-order field determining section 118 may supply in parallel different threshold data to the plurality of comparators 114, in order to generate $2^{(d-c+1)}$ pieces of threshold voltage which are substantially equally obtained by dividing a range, above a threshold voltage corresponding to the maximum of the threshold data in which the analog input signal is not less than the analog value according to this threshold data in the preceding phase and below a threshold voltage corresponding to the minimum of the threshold data in which the analog input signal is less than the analog value according to this threshold data in the preceding phase, by $2^{(d-c+1)}$ steps.

In the second high-order determination phase (S112), each of the plurality of comparators 114 supplied with the threshold data compares whether the analog input signal is not less than the analog value according to the corresponding threshold data. The high-order field determining section 118 narrows down a data value of the high-order field to be determined in this phase to a data value between the maximum of the threshold data in which the analog input signal is not less than the analog value according to this threshold data and the minimum of the threshold data in which the analog input signal is less than the analog value according to this threshold data, on the basis of the comparison results by the plurality of comparators 114. As an example, the high-order field determining section 118 may determine a data value of a high-order field in the digital output signal to a value of a high-order field in the maximum of the threshold data in which the analog input signal is not less than an analog value according to this threshold data. In the present example, the high-order field determining section 118 may determine a data value for the c-th and d-th bits in the digital output signal to a data value for the c-th and d-th bits of the maximum of the threshold data in which the analog input signal is not less than the analog value according to this threshold data.

As described above, in the high-order field determining step (S2), the high-order field determining section 118 performs at least one determination phase (high-order determination phase) in which a data value is determined by a multiple-bit conversion process, and determines the data value corresponding to the high-order field to be one.

In addition, in a multiple-bit conversion process, the high-order field determining section 118 may change correspondence between the plurality of threshold data to be generated and the plurality of comparators 114 that are supplied with the plurality of threshold data, for example, every conversion period. As an example, the high-order field determining section 118 may change correspondence between the plurality of threshold data and the plurality of comparators 114 in accordance with a random number. According to this, the A/D converter 10 can reduce noises because fluctuation of precision between the comparators 114 is averaged.

When the high-order field determining step (S2) is completed, in the low-order field determining step (S3), the low-order field computing section 120 and the low-order field determining section 122 compute a plurality of candidate values for a data value corresponding to a low-order field of the digital output signal by concurrently executing a successive approximation process several times, and determine one data value on the basis of the plurality of candidate values.

In the low-order field determining step (S3), the low-order field computing section 120 controls the threshold-value controlling section 126, in order to compute a plurality of candidate values for a data value corresponding to a low-order field by performing a successive approximation process by means of the plurality of comparators 114, for each of the plurality of groups which is obtained by dividing the plurality of comparators 114 one-by-one. In other words, the low-order field computing section 120 causes each of the plurality of comparators 114 to perform operations corresponding to the successive approximation process and computes a value corresponding to a low-order field in parallel. According to this, the low-order field computing section 120 can obtain the plurality of candidate values computed by the successive approximation process. In the present example, the low-order field computing section 120 may cause each of the plurality of comparators 114 to perform operations corresponding to the successive approximation process and compute the plurality of candidate values for the e-th and f-th bits.

Then, the low-order field determining section 122 determines the data value corresponding to the low-order field on the basis of the plurality of candidate values computed by the low-order field computing section 120. As an example, the low-order field determining section 122 may determine a mean value of the plurality of candidate values as the data value of the low-order field. In addition, as an example, the low-order field determining section 122 may determine, among the plurality of candidate values, a mean value of at least one candidate value, in which a difference between the mean value of the plurality of candidate values and the at least one candidate value is not more than a predetermined maximum error value, as the data value of the low-order field. According to this, the low-order field determining section 122 can perform analog-to-digital conversion with high precision. Moreover, the low-order field determining section 122 may determine a value after the decimal point of the mean value of the plurality of candidate values as a lower-order data value than this low-order field in the digital output signal.

As an example, the low-order field computing section 120 may perform the successive approximation process by means of the comparator 114 as described below.

First, in the high-order field determining step (S2), the low-order field computing section 120 sets the data value determined by the high-order field determining section 118 to the data value of the high-order field, and sets an initial value of the candidate value in which zero is the data value of the low-order field to the threshold data. Alternatively, the low-order field computing section 120 may set the data value determined by the high-order field determining section 118 to the data value of the high-order field, and set an initial value of the candidate value in which one is the data value of the low-order field to the threshold data.

Subsequently, the low-order field computing section 120 supplies the threshold data in which this bit in the candidate value is one to the comparator 114 of this group, sequentially from the most significant bit for each bit of from the most significant bit to the least significant bit of the low-order field. In other words, the low-order field computing section 120 causes each of the plurality of comparators 114 to compare the analog input signal and the analog value according to the supplied threshold data, while supplying a candidate value, in which bits sequentially become one from the most significant bit to the least significant bit in the low-order field from a state of an initial value, to the plurality of comparators 114 in parallel as the threshold data.

Alternatively, when setting the initial value of the candidate value in which the data value of the low-order field is one, the low-order field computing section 120 may supply the threshold data in which this bit in the candidate value is zero to the comparator 114 of this group, sequentially from the most significant bit for each bit of from the most significant bit to the least significant bit of the low-order field. In other words, the low-order field computing section 120 may cause each of the plurality of comparators 114 to compare the analog input signal and the analog value according to the supplied threshold data, while supplying a candidate value, in which bits sequentially become zero from the most significant bit to the least significant bit in the low-order field from the state of the initial value, to the plurality of comparators 114 in parallel as the threshold data.

Furthermore, the low-order field computing section 120 updates, for each bit from the most significant bit to the least significant bit of the low-order field, a candidate value by setting this bit of the candidate value to one when the analog input signal is not less than the analog threshold value according to the threshold data and this bit of the candidate value to zero when the analog input signal is less than the analog threshold value, on the basis of the comparison result by the comparator 114. In other words, the low-order field computing section 120 updates to one, at each timing at which one becomes sequentially from the most significant bit of the low-order field, a bit of a candidate value that becomes one at this timing when the analog input signal is not less than the analog threshold value according to the threshold data and updates to zero a bit of a candidate value that becomes one at this timing when the analog input signal is less than the analog threshold value according to the threshold data, for each of the plurality of comparators 114.

Alternatively, when setting an initial value of a candidate value in which a data value of a low-order field is one, the low-order field computing section 120 updates the candidate value by setting this bit of the candidate value to one when the analog input signal is larger than the analog threshold value according to the threshold data and this bit of the candidate value to zero when the analog input signal is not more than the analog threshold value. In other words, the low-order field computing section 120 updates to one, at each timing at which zero becomes sequentially from the most significant bit of the low-order field, a bit of a candidate value that becomes zero at this timing when the analog input signal is larger than the analog threshold value according to the threshold data and updates to zero a bit of a candidate value that becomes zero at this timing when the analog input signal is not more than the analog threshold value according to the threshold data, for each of the plurality of comparators 114.

As described above, since the low-order field computing section 120 changes a candidate value while setting the candidate value to one sequentially from the high-order bit from a state of an initial value (all bits are zero) and sequentially updates bits in the candidate value to one in accordance with the comparison results, the low-order field computing section 120 can sequentially perform analog-to-digital conversion every bit from the high-order bit.

Subsequently, the low-order field computing section 120 supplies a candidate value that is obtained by updating the candidate values to the least significant bit of the low-order field to the low-order field determining section 122. As described above, in the low-order field determining step (S3), the low-order field computing section 120 can determine the plurality of candidate values corresponding to the low-order field by a parallel successive approximation process.

In addition, as an example, the low-order field computing section 120 may further perform a parallel successive approximation process by multiple times in a time direction. In other words, the low-order field computing section 120 may perform by m times (m is an integer number one or more) a process computing the plurality of candidate values by a successive approximation process. Then, the low-order field determining section 122 may determine a data value corresponding to the low-order field on the basis of the plurality of candidate values computed by the low-order field computing section 120. As an example, the low-order field determining section 122 may determine a mean value of the plurality of candidate values as the data value of the low-order field.

Figure 11:
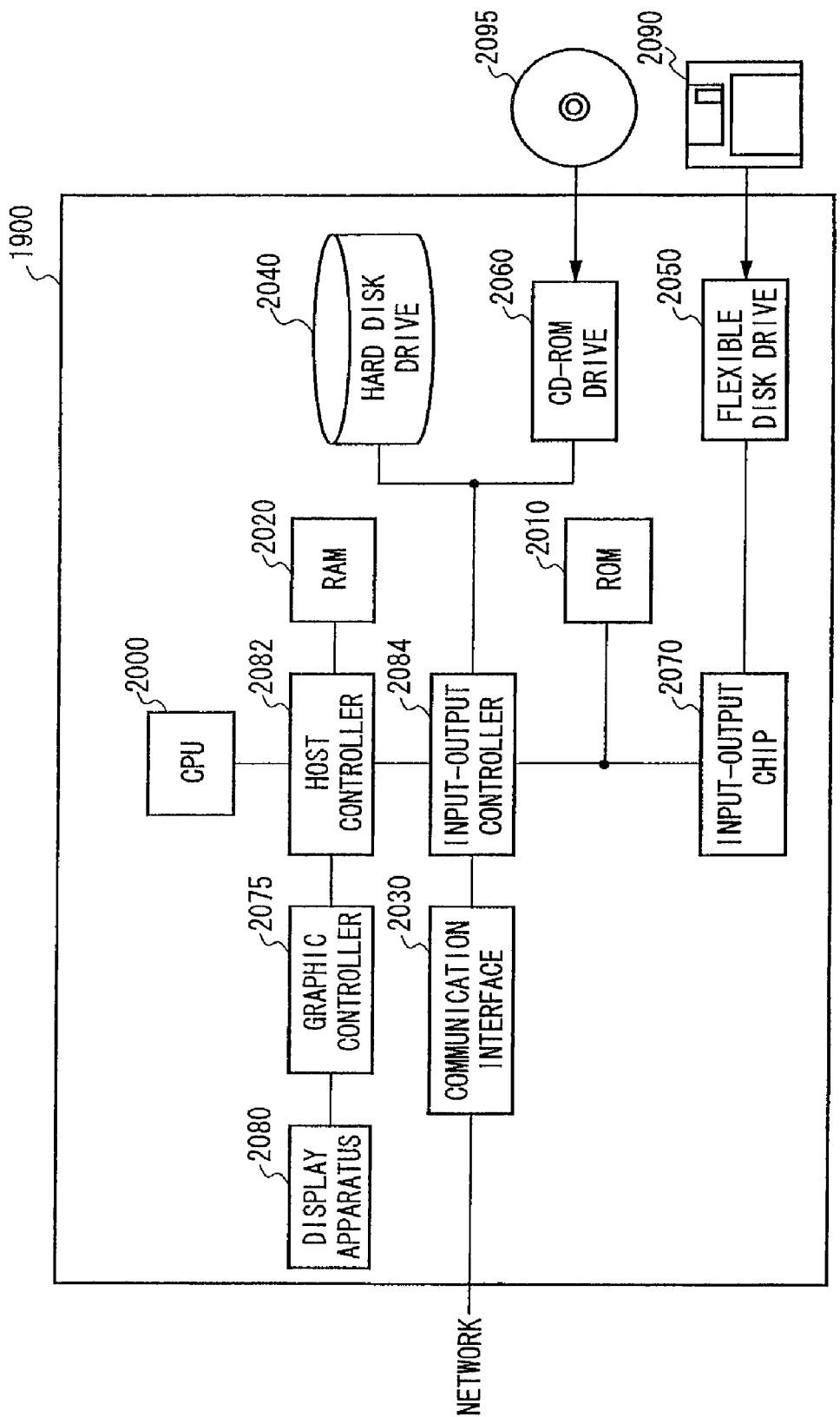
FIG. 11 is a view exemplary showing a hardware configuration of a computer 1900 according to an embodiment of the present invention.

FIG. 11 is a view exemplary showing a hardware configuration of a computer 1900 according to the present embodiment. The computer 1900 according to the present embodiment includes a CPU peripheral section, an input-output section, and a legacy input-output section. The CPU peripheral section has a CPU 2000, a RAM 2020, a graphic controller 2075, and a display apparatus 2080 that are interconnected by a host controller 2082. The input-output section has a communication interface 2030, a hard disk drive 2040, and a CD-ROM drive 2060 that are connected to the host controller 2082 by an input-output controller 2084. The legacy input-output section has a ROM 2010, a flexible disk drive 2050, and an input-output chip 2070 that are connected to the input-output controller 2084.

The host controller 2082 connects the RAM 2020 to the CPU 2000 and the graphic controller 2075 that access the RAM 2020 at high transfer rate. The CPU 2000 operates based on a program stored on the ROM 2010 and the RAM 2020, and controls each section. The graphic controller 2075 acquires image data to be generated by the CPU 2000 on a frame buffer provided in the RAM 2020, and displays the data on the display apparatus 2080. Alternatively, the graphic controller 2075 may include therein a frame buffer for storing image data generated from the CPU 2000.

The input-output controller 2084 connects the host controller 2082 to the communication interface 2030, the hard disk drive 2040, and the CD-ROM drive 2060 that are a comparatively fast input-output apparatus. The communication interface 2030 communicates with other apparatuses via network. The hard disk drive 2040 stores a program and data to be used by the CPU 2000 within the computer 1900. The CD-ROM drive 2060 reads a program or data from a CD-ROM 2095, and provides it to the hard disk drive 2040 via the RAM 2020.

Moreover, the ROM 2010 and the flexible disk drive 2050 and the input-output chip 2070 that are a comparatively low-speed input-output apparatus are connected to the input-output controller 2084. The ROM 2010 stores a boot program to be executed by the computer 1900 on starting and a program or the like dependent on hardware of the computer 1900. The flexible disk drive 2050 reads a program or data from a flexible disk 2090, and provides it to the hard disk drive 2040 via the RAM 2020. The input-output chip 2070 connects a various types of input-output apparatuses via the flexible disk drive 2050 and a parallel port, a serial port, a keyboard port, a mouse port, or the like.

A program provided to the hard disk drive 2040 via the RAM 2020 is stored on the flexible disk 2090, the CD-ROM 2095, or a recording medium such as an IC card, to be provided by a user. A program is read from a recording medium, is installed in the hard disk drive 2040 within the computer 1900 via the RAM 2020, and is executed in the CPU 2000.

A program that is installed in the computer 1900 and makes the computer 1900 function as a control apparatus for the A-D converter 10 includes a bit selecting module, a threshold-value controlling module, a bit determining module, a storing module, a timing controlling module, and a sequencer module. These program and modules work on the CPU 2000 or the like, and makes the computer 1900 respectively function as the bit selecting section 18, the threshold-value controlling section 20, the bit determining section 26, the storing section 28, the timing controlling section 30, and the sequencer 32.

These program and modules described above may be stored on an outside recording medium. A recording medium can include an optical recording medium such as DVD and CD, a magneto-optical recording medium such as MO, a tape medium, a semiconductor memory such as an IC card in addition to the flexible disk 2090 and the CD-ROM 2095. Moreover, a storage device such as a hard disk or a RAM provided in a server system connected to a private communication network and Internet may be used as a recording medium, and a program may be provided to the computer 1900 via a network.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An A/D converter that outputs a digital output signal obtained by digitalizing an analog input signal, comprising:
   a bit selecting section that selects a conversion object bit from a high-order bit to a low-order bit of the digital output signal in order;
   a threshold-value controlling section that determines a threshold data expressing a boundary value between zero and one of the conversion object bit on the basis of an already-determined value of a higher-order bit than the conversion object bit;
   a D/A converting section that digital-to-analog converts the threshold data and generates an analog threshold value;
   a comparing section that compares, at a plurality of different timings in a conversion time interval determining a value of the conversion object bit, the analog input signal and the analog threshold value and outputs a plurality of comparison results at the timings; and
   a bit determining section that determines the value of the conversion object bit on the basis of the plurality of comparison results.

2. The A/D converter as claimed in claim 1, wherein the bit determining section determines the value of the conversion object bit by referring to the plurality of comparison results by majority decision.

3. The A/D converter as claimed in claim 1, wherein
   the comparing section has a plurality of comparators of which each compares the analog input signal and the analog threshold value,
   the A/D converter further comprises a timing controlling section that controls a comparison timing at which the analog input signal and the analog threshold value are compared in each of the plurality of comparators, and
   the timing controlling section causes a first comparator of the plurality of comparators to perform the comparison at a first timing in the conversion time interval determining the value of the conversion object bit and a second comparator of the plurality of comparators to perform the comparison at a second timing different from the first timing in the conversion time interval.

4. The A/D converter as claimed in claim 3, wherein
   the timing controlling section delays a sampling clock determining a conversion time interval for one bit of the digital output signal by means of a delay element having a delay amount less than one period of the sampling clock, in order to generate a first strobe signal specifying the first timing and a second strobe signal specifying the second timing, the first comparator compares the analog input signal and the analog threshold value according to the first strobe signal, and the second comparator compares the analog input signal and the analog threshold value according to the second strobe signal.

5. The A/D converter as claimed in claim 3, wherein the timing controlling section lengthens a conversion time interval of a predetermined bit of the digital output signal in comparison with a conversion time interval of a higher-order bit than the predetermined bit.

6. The A/D converter as claimed in claim 1, wherein the A/D converter further comprises a timing controlling section that generates strobe signals specifying the plurality of timings in the conversion time interval for one bit of the digital output signal, the comparing section comprises:

a comparator that compares the analog input signal and the analog threshold value at a timing specified by the strobe signal; and a comparison result storing section that includes one or more registers serially connected to one another, a first-stage register acquiring and storing a comparison result by the comparator at a timing specified by the strobe signal and registers after a second stage acquiring and storing a comparison result stored on a preceding-stage register at a timing specified by the strobe signal, and the bit determining section determines a value of the conversion object bit on the basis of the comparison results at the plurality of timings stored on the comparison result storing section.

7. The A/D converter as claimed in claim 6, wherein the timing controlling section increases a number of timings in a conversion time interval for a predetermined bit of the digital output signal in comparison with a number of timings in a conversion time interval for a higher-order bit than the predetermined bit.

8. The A/D converter as claimed in claim 1, wherein the comparing section determines the plurality of timings in the conversion time interval on the basis of a random number.

9. An A/D converter that outputs a digital output signal obtained by digitalizing an analog input signal, comprising:

a plurality of comparators of which each compares the analog input signal and an analog threshold value according to a specified digital threshold data;

a high-order field determining section that narrows down a data value corresponding to a high-order field for a predetermined bit number in the digital output signal on the basis of a plurality of comparison results obtained by supplying different threshold data to the plurality of comparators;

a low-order field computing section that computes a plurality of candidate values for a data value corresponding to a low-order field for a predetermined number of bits located at a side lower than the high-order field by means of the plurality of comparators;

a low-order field determining section that determines the data value corresponding to the low-order field on the basis of the plurality of candidate values; and a timing controlling section that causes, when computing the plurality of candidate values of the data value corresponding to the low-order field, a first comparator among the plurality of comparators to compare the analog input signal and the analog threshold value at a first timing in a conversion time interval determining a value for one bit and causes a second comparator among the plurality of comparators to compare the analog input signal and the analog threshold value at a second timing different from the first timing in the conversion time interval.

10. An A/D convert method for outputting a digital output signal obtained by digitalizing an analog input signal, comprising:

selecting a conversion object bit from a high-order bit to a low-order bit of the digital output signal in order;

determining a threshold data expressing a boundary value between zero and one of the conversion object bit on the basis of an already-determined value of a higher-order bit than the conversion object bit;

digital-to-analog converting the threshold data and generating an analog threshold value;

comparing, at a plurality of different timings in a conversion time interval determining a value of the conversion object bit, the analog input signal and the analog threshold value and outputting a plurality of comparison results at the timings; and determining the value of the conversion object bit on the basis of the plurality of comparison results.

11. An A/D convert method for outputting a digital output signal obtained by digitalizing an analog input signal, comprising:

narrowing down a data value corresponding to a high-order field for a predetermined bit number in the digital output signal on the basis of a plurality of comparison results obtained by supplying different threshold data to a plurality of comparators of which each compares the analog input signal and an analog threshold value according to a specified digital threshold data;

computing a plurality of candidate values for a data value corresponding to a low-order field for a predetermined number of bits located at a side lower than the high-order field by means of the plurality of comparators;

determining the data value corresponding to the low-order field on the basis of the plurality of candidate values; and causing, when computing the plurality of candidate values of the data value corresponding to the low-order field, a first comparator among the plurality of comparators to compare the analog input signal and the analog threshold value at a first timing in a conversion time interval determining a value for one bit and causing a second comparator among the plurality of comparators to compare the analog input signal and the analog threshold value at a second timing different from the first timing in the conversion time interval.

* * * * *